(12) United States Patent
Jung et al.

(10) Patent No.: US 9,905,654 B2
(45) Date of Patent: Feb. 27, 2018

(54) BRIDGE DIODE

(71) Applicant: ELECTRONICS AND TELECOMMUNICATIONS RESEARCH INSTITUTE, Daejeon (KR)

(72) Inventors: Dong Yun Jung, Daejeon (KR); Hyun Soo Lee, Goyang-si (KR); Sang Choon Ko, Daejeon (KR); Minki Kim, Daejeon (KR); Jeho Na, Seoul (KR); Eun Soo Nam, Daejeon (KR); Young Rak Park, Daejeon (KR); Junbo Park, Seoul (KR); Hyung Seok Lee, Daejeon (KR); Hyun-Gyu Jang, Cheongju-si (KR); Chi Hoon Jun, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/215,414

(22) Filed: Jul. 20, 2016

(65) Prior Publication Data

US 2017/0025550 A1    Jan. 26, 2017

(30) Foreign Application Priority Data

Jul. 21, 2015 (KR) .................. 10-2015-0103134
Jan. 20, 2016 (KR) .................. 10-2016-0007195

(51) Int. Cl.
*H01L 29/205* (2006.01)
*H01L 29/66* (2006.01)
(Continued)

(52) U.S. Cl.
CPC ...... *H01L 29/205* (2013.01); *H01L 29/66212* (2013.01); *H01L 29/872* (2013.01); *H01L 29/2003* (2013.01)

(58) Field of Classification Search
CPC . H01L 29/205; H01L 29/778; H01L 29/7786; H01L 29/66431; H01L 29/8613;
(Continued)

(56) References Cited

U.S. PATENT DOCUMENTS 5,468,976 A * 11/1995 Evseev ................ H01L 25/072
257/104
8,987,870 B2    3/2015 Tseng
(Continued)

*Primary Examiner* — Tucker J Wright
(74) *Attorney, Agent, or Firm* — Rabin & Berdo, P.C.

(57) ABSTRACT

Provided is a bridge diode according to an embodiment of the inventive concept. The bridge diode includes a first structure including a first lower nitride film and a first upper nitride film, which are laminated on the substrate, a second structure including a second lower nitride film and a second upper nitride film, which are laminated on the substrate, a first electrode structural body disposed on the first structure, and a second electrode structural body disposed on the second structure. The first electrode structural body includes a first electrode, a second electrode, and a third electrode, which are arranged in a clockwise direction, the second electrode structural body includes a fourth electrode, a fifth electrode, and a sixth electrode, which are arranged in a clockwise direction, the first electrode and the sixth electrode, which are connected to each other, are connected to an external circuit, the third electrode and the fourth electrode, which are connected to each other, are connected to an external circuit, and each of the second electrode and the fifth electrode is connected to the external circuit.

14 Claims, 18 Drawing Sheets

(51) Int. Cl.
*H01L 29/872* (2006.01)
*H01L 29/20* (2006.01)

(58) Field of Classification Search
CPC ........... H01L 29/66462; H01L 21/0254; H01L 21/12032; H02M 7/219
See application file for complete search history.

(56) References Cited

U.S. PATENT DOCUMENTS

| | | | |
|---|---|---|---|
| 2006/0108605 A1* | 5/2006 | Yanagihara | H01L 29/66143 257/199 |
| 2014/0077302 A1 | 3/2014 | Park et al. | |
| 2014/0197449 A1 | 7/2014 | Park et al. | |
| 2015/0008564 A1* | 1/2015 | Tseng | H01L 27/0814 257/658 |

* cited by examiner

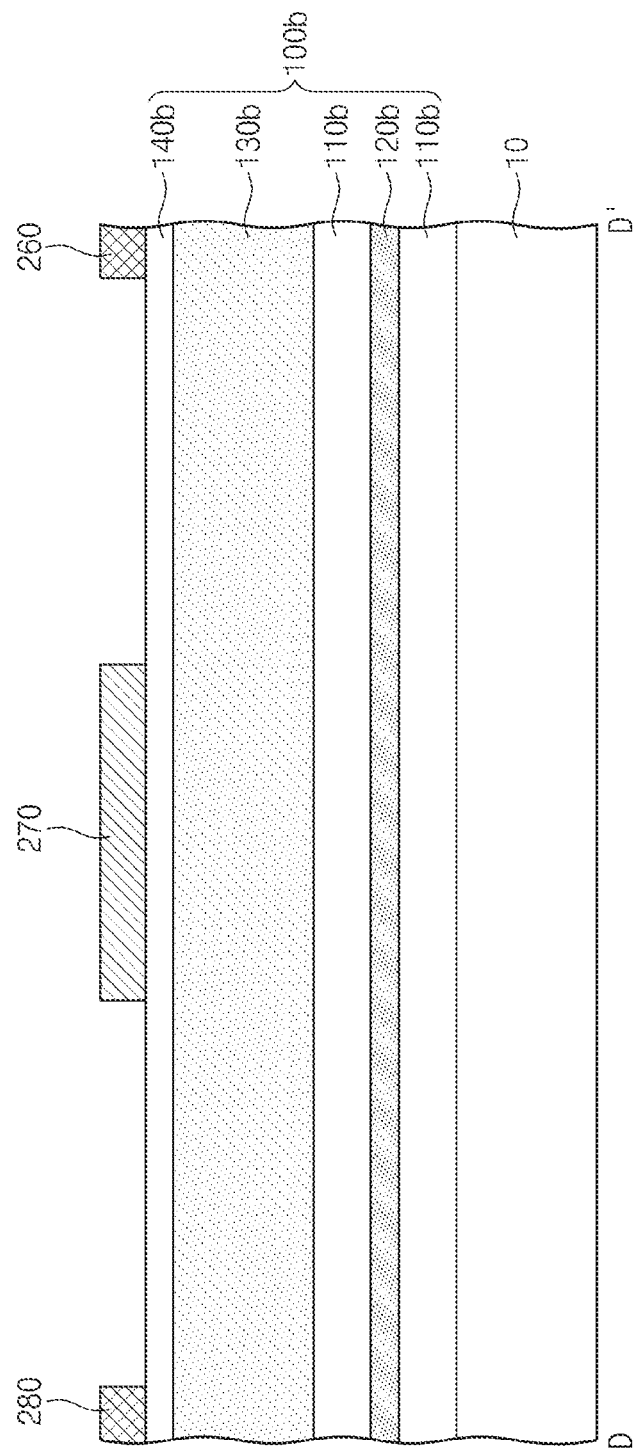

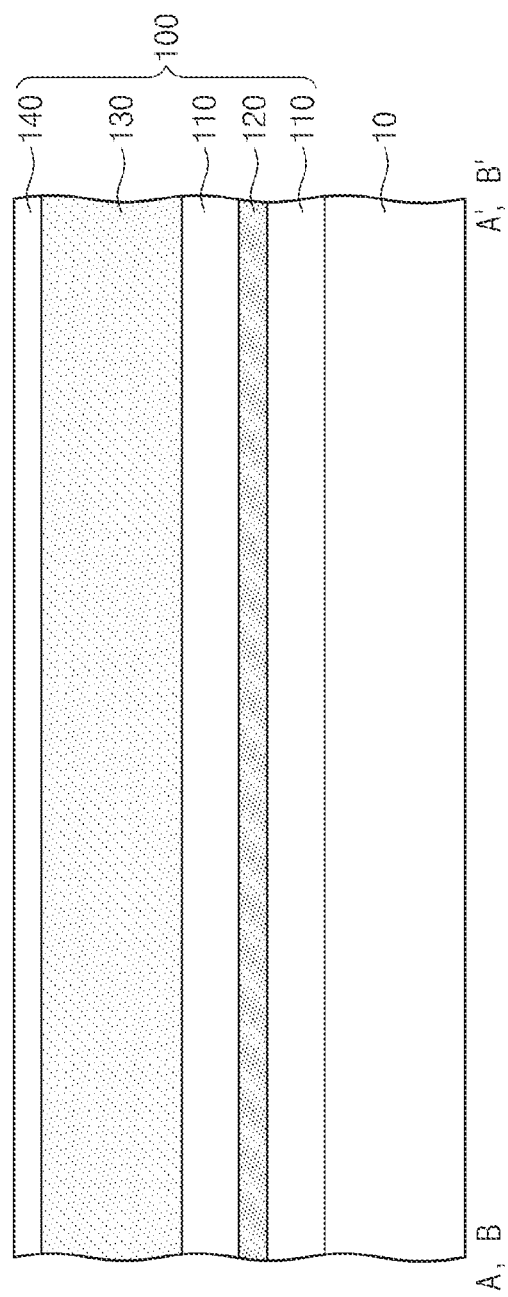

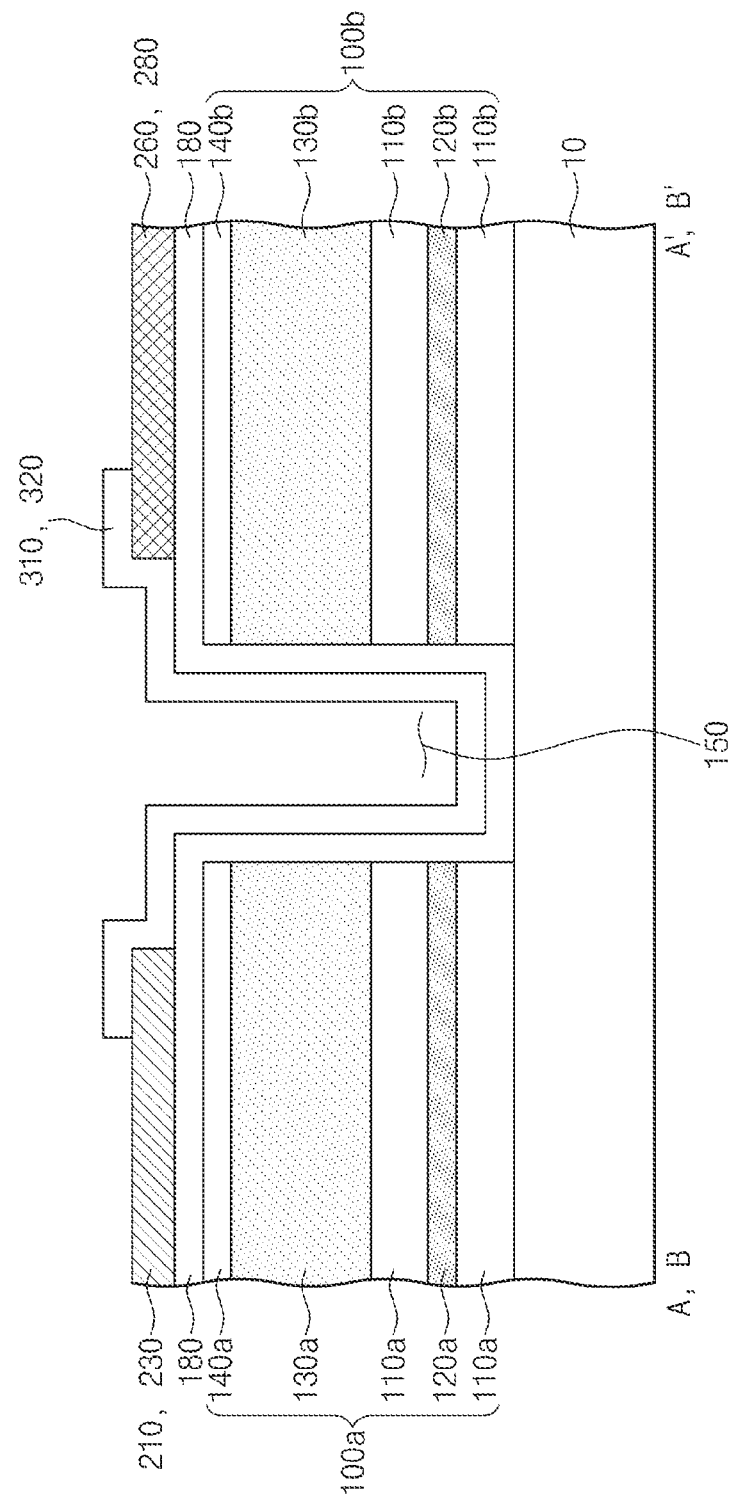

BRIDGE DIODE

CROSS-REFERENCE TO RELATED APPLICATIONS

This U.S. non-provisional patent application claims priority under 35 U.S.C. § 119 of Korean Patent Application Nos. 10-2015-0103134, filed on Jul. 21, 2015, and 10-2016-0007195, filed on Jan. 20, 2016, the entire contents of which are hereby incorporated by reference.

BACKGROUND

The present disclosure relates to a diode, and more particularly, to a bridge diode formed on one substrate.

In recent years, as interest in high efficiency and miniaturization of a power conversion module has been extremely increased, researches on gallium nitride (GaN) power semiconductor has been actively progressing. In general, a bridge diode has been used for a switch mode power supply (SMPS), an adaptor, and all of AC-to-DC power conversion. In general, a device in which four diode chips are coupled to each other is packaged to be used for realizing the bridge diode.

SUMMARY

The present disclosure provides a bridge diode including an isolation region provided between a first structure and a second structure.

The present disclosure also provides a method for manufacturing a bridge diode, which is capable of providing the bridge diode using a nitride based semiconductor layer on one substrate.

An embodiment of the inventive concept provides a bridge diode. The bridge diode includes a substrate; a first structure including a first lower nitride film and a first upper nitride film, which are laminated on the substrate; a second structure including a second lower nitride film and a second upper nitride film, which are laminated on the substrate; a first electrode structural body disposed on the first structure; and a second electrode structural body disposed on the second structure. The first electrode structural body includes a first electrode, a second electrode, and a third electrode, the second electrode structural body includes a fourth electrode, a fifth electrode, and a sixth electrode, the first electrode and the sixth electrode, which are connected to each other, are connected to an external circuit the third electrode and the fourth electrode, which are connected to each other, are connected to an external circuit, and each of the second electrode and the fifth electrode is connected to the external circuit.

In an embodiment, the first lower nitride film and the second lower nitride film may include first and second 2-dimensional electron gas (2DEG) layers, respectively, and the first 2DEG layer and the second 2DEG layer may be spaced apart from each other.

In an embodiment, the first electrode and the sixth electrode may be disposed to face each other, and the third electrode and the fourth electrode may be disposed to face each other.

In an embodiment, the first electrode and the third electrode may have first and third extension parts each of which extends toward the second electrode, respectively, and the second electrode may have a second extension part extending toward the first electrode and the third electrode.

In an embodiment, each of the first extension part, the second extension part, and the third extension part may be provided in plurality to be spaced apart from each other.

In an embodiment, the fourth electrode and the sixth electrode may have fourth and sixth extension parts each of which extends toward the fifth electrode, respectively, and the fifth electrode may have a fifth extension part extending toward the fourth electrode and the sixth electrode.

In an embodiment, each of the fourth extension part, the fifth extension part, and the sixth extension part may be provided in plurality to be spaced apart from each other.

In an embodiment, the first electrode, the third electrode, and the fifth electrode may be anodes which form a schottky-contact with first structure and the second structure, and the second electrode, the fourth electrode, and the sixth electrode may be cathodes which form an ohmic-contact with the first structure and the second structure.

In an embodiment, the first and second lower nitride films may be made of gallium nitride (GaN), and the first and second upper nitride films may be made of aluminum gallium nitride (AlGaN) or aluminum nitride (AlN).

In an embodiment, the bridge diode may further include a first cap layer disposed between the first structure and the first electrode structural body and a second cap layer disposed between the second structure and the second electrode structural body.

In an embodiment of the inventive concept, a bridge diode include: a semiconductor layer disposed on a substrate; and an electrode structural body disposed on the semiconductor layer. The electrode structural body includes a first electrode, a second electrode, a third electrode, a fourth electrode, a fifth electrode, and a sixth electrode, the first electrode and the sixth electrode, which are connected to each other, are connected to the external circuit, the third electrode and the fourth electrode, which are connected to each other, are connected to an external circuit, each of the second electrode and the fifth electrode are connected to the external circuit, and the semiconductor layer has an isolation region configured to separate the first, second, and third electrodes from the fourth, fifth, and sixth electrodes.

In an embodiment, the isolation region may be recessed from a top surface of the semiconductor layer toward the substrate to expose a top surface of the substrate.

In an embodiment, the semiconductor layer may include a lower nitride film and an upper nitride film, which are sequentially laminated on the substrate, the lower nitride film may have a 2-dimensional electron gas (2DEG) layer therein, and the isolation region may be recessed from the top surface of the semiconductor layer toward the lower nitride film to separate the 2DEG layer.

In an embodiment, the bridge diode may further include a first wire configured to connect the first electrode to the sixth electrode and a second wire configured to connect the third electrode to the fourth electrode.

In an embodiment, the first electrode, the third electrode, and the fifth electrode may form a schottky-contact with the semiconductor layer, and the second electrode, the fourth electrode, and the sixth electrode may form an ohmic-contact with the semiconductor layer.

In an embodiment of the inventive concept, a method for manufacturing a bridge diode, the method include: forming a semiconductor layer comprising a lower nitride film and an upper nitride film on a substrate; forming an isolation region to divide the semiconductor layer into a first structure and a second structure; forming an electrode structural body comprising a first electrode, a second electrode, a third electrode, a fourth electrode, a fifth electrode, and a sixth electrode on the first structure and the second structure; and connecting the first electrode to the sixth electrode so that the electrodes are connected to an external circuit, connecting the third electrode to the fourth electrode so that the electrodes are connected to an external circuit and connecting each of the second electrode and the fifth electrode to an external circuit. The isolation region is formed between the first, second, and third electrodes and the fourth, fifth, and sixth electrodes.

In an embodiment, the first electrode, the second electrode, and the third electrode may be formed on the first structure, and the fourth electrode, the fifth electrode, and the sixth electrode may be formed on the second structure.

In an embodiment, the isolation region may be formed by performing mesa etching from the upper nitride film toward the lower nitride film to separate a 2-dimensional electron gas (2DEG) layer formed in the lower nitride film, the first electrode and the sixth electrode may be connected to each other through an air-bridge metal, and the third electrode and the fourth electrode are connected to each other through an air-bridge metal.

In an embodiment, the method may further include forming a protection film on the upper nitride film before the electrode structural body is formed. The isolation region may be formed by performing mesa etching from the upper nitride film toward the lower nitride film to separate a 2-dimensional electron gas (2DEG) layer formed in the lower nitride film, the first electrode and the sixth electrode may be connected to each other through a first wire, and the third electrode and the fourth electrode may be connected to each other through a second wire, in which each of the first and second wires is formed on the protection film.

In an embodiment, the isolation region may be formed by injecting a p-type impurity from the upper nitride film toward the lower nitride film to separate a 2-dimensional electron gas (2DEG) layer formed in the lower nitride film, first electrode and the sixth electrode may be connected to each other through a second metal wire, which is formed on the semiconductor layer into which the p-type impurity is injected, and the third electrode and the fourth electrode may be connected to each other through the second metal wire.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 5 is a cross-sectional view taken along line D-D' of FIG. 2;

FIGS. 6A to 6D are cross-sectional views illustrating a method for manufacturing the bridge diode in FIG. 3;

FIGS. 9A to 9C are cross-sectional views illustrating a method for manufacturing the bridge diode in FIG. 8;

DETAILED DESCRIPTION

Figure 1:
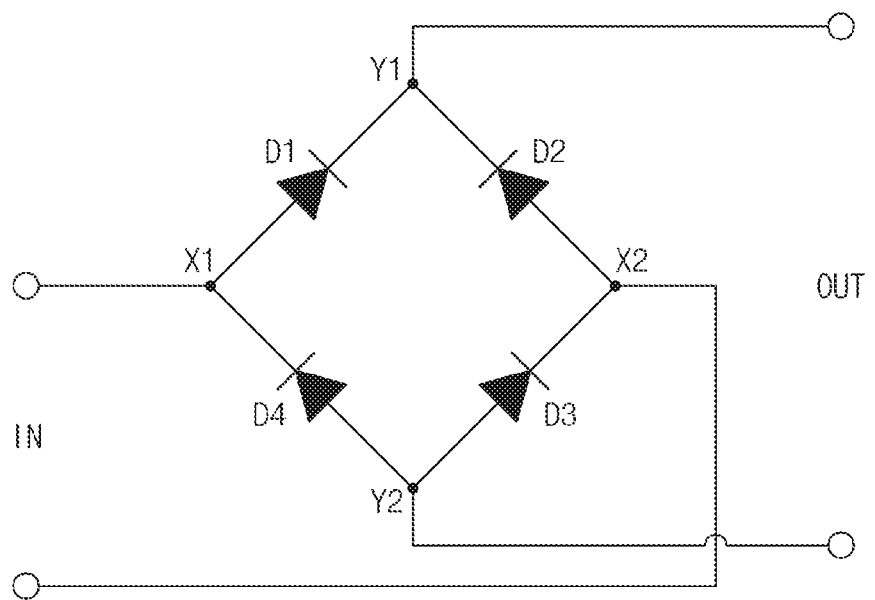
FIG. 1 is a circuit diagram of a bridge diode according to an embodiment of the inventive concept.

Advantages and features of the present invention, and implementation methods thereof will be clarified through following embodiments described with reference to the accompanying drawings. The present invention may, however, be embodied in many different forms and should not be construed as being limited to the embodiments set forth herein. Rather, these embodiments are provided so that this disclosure will be thorough and complete, and will fully convey the concept of the invention to those skilled in the art. Further, the present invention is only defined by scopes of claims. Like reference numerals refer to like elements throughout.

The embodiments in the detailed description will be described with sectional views and/or plain views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. For example, an etched region having a right angle illustrated in the drawings may have a round shape or a shape having a predetermined curvature. Areas exemplified in the drawings have general properties, and are used to illustrate a specific shape of a semiconductor package region. Thus, this should not be construed as limited to the scope of the present invention.

Figure 2:
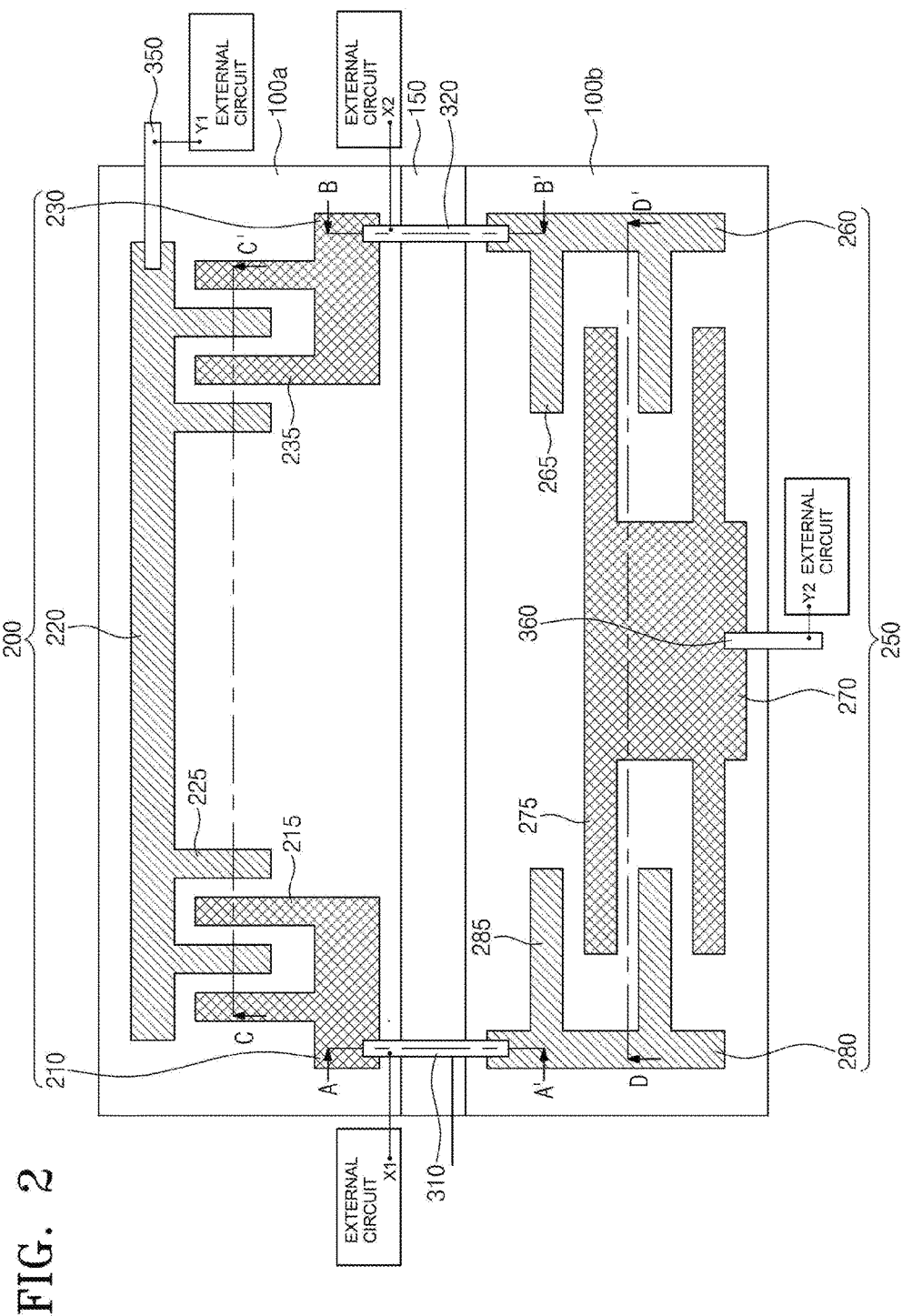
FIG. 2 is a plan view of the bridge diode according to an embodiment of the inventive concept.

FIG. 1 is a circuit diagram of a bridge diode according to an embodiment of the inventive concept, and FIG. 2 is a plan view of the bridge diode according to an embodiment of the inventive concept.

Referring to FIGS. 1 and 2, a bridge diode 1 may include a first structure 100a, a second structure 100b, a first electrode structural body 200, and a second electrode structural body 250. An isolation region 150 may provide between the first structure 100a and the second structure 100b. The first structure 100a and the second structure 100b may be nitride based semiconductor layers. The isolation region 150 may separate the first structure 100a and the second structure 100b from each other. The isolation region 150 may separate the first electrode structural body 200 and the second electrode structural body 250 from each other.

The first electrode structural body 200 may be disposed on the first structure 100a, and the second electrode structural body 250 may be disposed on the second structure 100b. The first electrode structural body 200 may include a first electrode 210, a second electrode 220, and a third electrode 230, and the second electrode structural body 250 may include a fourth electrode 260, a fifth electrode 270, and a sixth electrode 280. The first to sixth electrodes 210, 220, 230, 260, 270, and 280 may be arranged in a clockwise direction on the first structure 100a and the second structure 100b. The first to sixth electrodes 210, 220, 230, 260, 270, and 280 may be spaced apart from each other. For example, the first electrode 210 and the third electrode 230 may be disposed on either side of the second electrode 220, and the fourth electrode 260 and the sixth electrode 280 may be disposed on either side of the fifth electrode 270. Also, the first electrode 210 and the sixth electrode 280 may be disposed to face each other, and the third electrode 230 and the fourth electrode 260 may be disposed to face each other.

For example, each of the first electrode 210, the third electrode 230, and the fifth electrode 270 may be an anode which form a schottky-contact with the first structure 100a and the second structure 100b, and each of the second electrode 220, the fourth electrode 260, and the sixth electrode 280 may be a cathode which forman ohmic-contact with the first structure 100a and the second structure 100b. For example, the anode may be made of nickel (Ni) or gold (Au), and the cathode may be an alloy containing at least one or more from nickel (Ni), gold (Au), aluminum (Al), titanium (Ti), or molybdenum (Mo).

The first electrode 210 may include a first extension part 215, the second electrode 220 may include a second extension part 225, and the third electrode 230 may include a third extension part 235. The first extension part 215 and the third extension part 235 may extend toward the second electrode 220. The second extension part 225 may extend toward the first electrode 210 and the third electrode 230. Each of the first to third extension parts 215, 225, and 235 may be provided in plurality.

The fourth electrode 260 may include a fourth extension part 265, the fifth electrode 270 may include a fifth extension part 275, and the sixth electrode 280 may include a sixth extension part 285. The fourth extension part 265 and the sixth extension part 285 may extend toward the fifth electrode 270. The fifth extension part 275 may extend toward the fourth electrode 260 and the sixth electrode 280. Each of the fourth to sixth extension parts 265, 275, and 285 may be provided in plurality.

According to arrangement relationship of the first to sixth extension parts 215, 225, 235, 265, 275, and 285, an area occupied by the first and second electrode structural bodies 200 and 250 on the first structure 100a and the second structure 100b may be maximized. Thus, the first and second electrode structural bodies 200 and 250 may be efficiently disposed on a restricted area.

The first electrode 210 and the sixth electrode 280 may be connected through a first wire 310, and the third electrode 230 and the fourth electrode 260 may be connected through a second wire 320. The first wire 310 may be connected to an external circuit, and the first wire 310 may be connected to the external circuit at a first point X1. The second wire 320 may be connected to an external circuit, and the second wire 320 may be connected to the external circuit at a second point X2.

The second electrode 220 may be connected to the external circuit through a third wire 350, and the fifth electrode 270 may be connected to the external circuit through a fourth wire 360. The second electrode 220 may be connected to the third wire 350 at a third point Y1. The fifth electrode 270 may be connected to the fourth wire 360 at a fourth point Y2.

According to an embodiment of the inventive concept, the first electrode 210 and the second electrode 220 may constitute a first diode D1, the second electrode 220 and the third electrode 230 may constitute a second diode D2, the fourth electrode 260 and the fifth electrode 270 may constitute a third diode D3, and the fifth electrode 270 and the sixth electrode 280 may constitute a fourth diode D4. When the bridge diode 1 is driven, a signal may be applied between the first point X1 and the second point X2, and a signal is outputted between the third point Y1 and the fourth point Y2. In detail, when a positive signal is applied between the first point X1 and the second point X2, the first diode D1 and the fourth diode D4 are turned-on to output the positive signal. When a negative signal is applied between the first point X1 and the second point X2, the second diode D2 and the third diode D3 are turned-on to output the positive signal. Accordingly, when an AC signal is applied between the first point X1 and the second point X2, a full-wave rectified signal may be outputted between the third point Y1 and the fourth point Y2.

In general, four diodes may be connected to each other to constitute the bridge diode. The bridge diode 1 according to an embodiment of the inventive concept may perform the same function as that of the four diodes through disposing the first electrode structural body 200 and the second electrode structural body 250 on the nitride based semiconductor layer provided on one substrate 10. Through this, the cost for manufacturing the bridge diode 1 may decrease, and the size thereof may be reduced.

For another example, the first electrode structural body 200 and the second electrode structural body 250 may be disposed in the form of various layouts. For example, the first electrode structural body 200 and the second electrode structural body 250 may be symmetric to each other.

Figure 3:
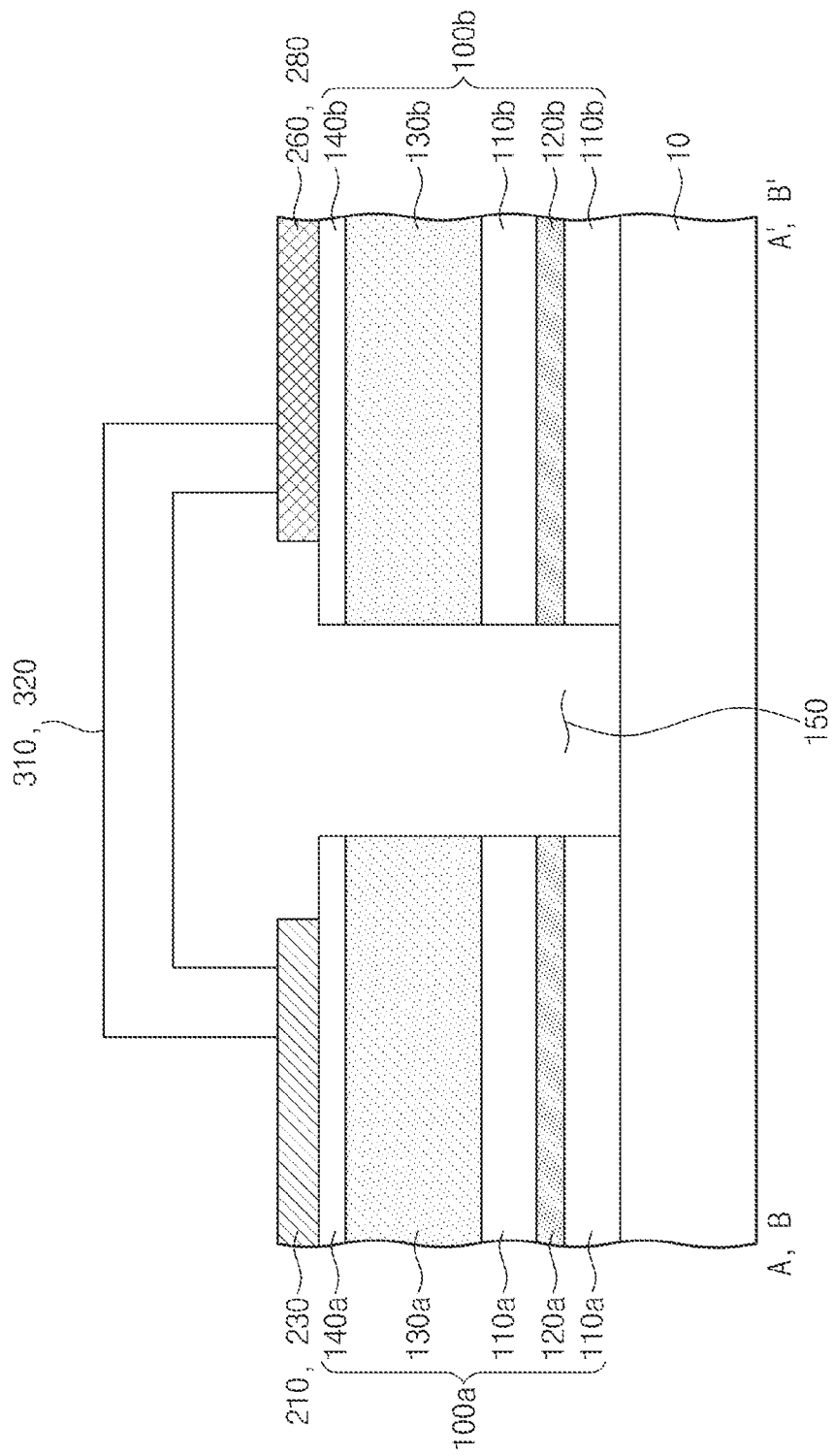
FIG. 3 is a cross-sectional view taken along line A-A' or B-B' of FIG. 2.

FIG. 3 is a cross-sectional view taken along line A-A' or B-B' of FIG. 2. The cross-sectional view taken along line A-A' and cross-sectional view taken along line B-B' may have the same structure.

Referring to FIGS. 2 and 3, the first structure 100a and the second structure 100b may be disposed on the substrate 10. The substrate 10 may be any one of sapphire, silicon, gallium nitride (GaN), and silicon carbide (SiC). The first structure 100a may include a first lower nitride film 110a, a first upper nitride film 130a, and a first cap layer 140a, which are sequentially disposed on the substrate 10, and the second structure 100b may include a second lower nitride film 110b, a second upper nitride film 130b, and a second cap layer 140b, which are sequentially disposed on the substrate 10.

The first lower nitride film 110a and the second lower nitride film 110b may be disposed on the substrate 10. The first lower nitride film 110a and the second lower nitride film 110b may be made of gallium nitride (GaN). A first 2-dimensional electron gas (2DEG) layer 120a may be provided in the first lower nitride film 110a, and a second 2DEG layer 120b may be provided in the second lower nitride film 110b. The first 2DEG layer 120a and the second 2DEG layer 120b may have high conductivity to serve as a channel through which current flows.

The first upper nitride film 130a and the second upper nitride film 130b may be respectively disposed on the first lower nitride film 110a and the second lower nitride film 110b. The first upper nitride film 130a and the second upper nitride film 130b may have a greater energy band gap than that of the first lower nitride film 110a and the second lower nitride film 110b. The first upper nitride film 130a and the second upper nitride film 130b may include aluminum gallium nitride (AlGaN) or aluminum nitride (AlN).

The first cap layer 140a and the second cap layer 140b may be respectively disposed on the first upper nitride film 130a and the second upper nitride film 130b. The first cap layer 140a and the second cap layer 140b may be made of gallium nitride (GaN). The first cap layer 140a and the second cap layer 140b may protect surfaces of the first upper nitride film 130a and the second upper nitride film 130b.

The isolation region 150 may provide between the first structure 100a and the second structure 100b. The isolation region 150 may enable the first structure 100a and the second structure 100b to be separated from each other and expose a top surface of the substrate 10. In detail, the isolation region 150 may separate the first 2DEG layer 120a, which disposed in the first lower nitride film 110a, and the second 2DEG layer 120b, which disposed in the second lower nitride film 110b, from each other. Through the isolation region 150, a diode may not be provided between the first structure 100a and the second structure 100b.

For another example, the first cap layer 140a and the second cap layer 140b may be unessential elements. For example, the first structure 100a may include the first lower nitride film 110a and the first upper nitride film 130a, which are sequentially disposed on the substrate 10, and the second structure 100b may include a second lower nitride film 110b and a second upper nitride film 130b, which are sequentially disposed on the substrate 10.

A first electrode 210 or a third electrode 230 may be disposed on the first cap layer 140a, and a fourth electrode 260 or a sixth electrode 280 may be disposed on the second cap layer 140b. The first electrode 210 or the third electrode 230 may be anodes which form the schottky-contact with the first structure 100a that is a semiconductor layer, and the fourth electrode 260 or the sixth electrode 280 may be cathodes which form the ohmic-contact with the second structure 100b that is a semiconductor layer. For example, the anode may be made of nickel (Ni) or gold (Au), and the cathode may be an alloy containing at least one or more from nickel (Ni), gold (Au), aluminum (Al), titanium (Ti), silicon (Si), or molybdenum (Mo).

The first wire 310 or the second wire 320 may connect the first structure 100a to the second structure 100b. In detail, the first wire 310 may connect the first electrode 210 to the sixth electrode 280, and the second wire 320 may connect the third electrode 230 to the fourth electrode 260. For example, the first wire 310 or the second wire 320 may be made of air bridge metal For example, the first wire 310 or the second wire 320 may be metal containing at least one or more from copper (Cu), gold (Au), and nickel (Ni).

Figure 4:
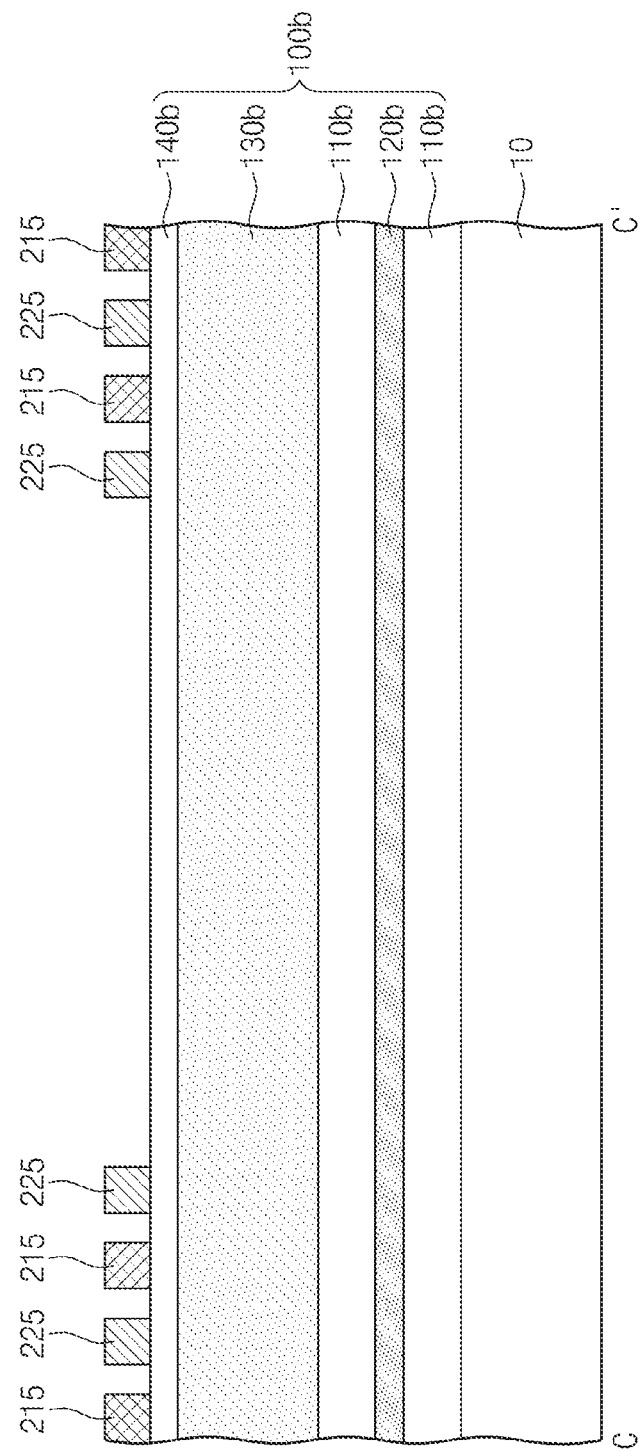
FIG. 4 is a cross-sectional view taken along line C-C' of FIG. 2.

FIG. 4 is a cross-sectional view taken along line C-C' of FIG. 2. For simplicity of description, describing contents overlapped with those of FIG. 2 will be omitted.

Referring to FIGS. 2 and 4, the first structure 100a may be disposed on the substrate 10. The first extension parts 215 of the first electrode 210, the second extension parts 225 of the second electrode 220, and the third extension parts 235 of the third electrode 230 may be disposed on the first structure 100a. The first extension parts 215 and the third extension parts 235 may be disposed opposite to each other. The first extension parts 215 and the second extension parts 235 may be alternately disposed, and the third extension parts 235 and the second extension parts 225 may be alternately disposed.

The first extension parts 215 and the third extension parts 235 may be the anodes, and the second extension parts may be the cathodes. The first to third extension parts 215, 225, and 235 may share the first structure 100a that is the semiconductor layer and may be electrically connected to each other because current flows through the first 2DEG layer 120a. Accordingly, the diode may be provided between the first extension parts 215 and the second extension parts 225, and the diode may be provided between the second extension parts 225 and the third extension parts 235.

FIG. 5 is a cross-sectional view taken along line D-D' of FIG. 2. For convenience of description, describing overlapped contents will be omitted.

Referring to FIGS. 2 and 5, the second structure 100b may be disposed on the substrate 10. The fourth electrode 260, the fifth electrode 270, and the sixth electrode 280 may be disposed on the second structure 100b. The fourth electrode 260 and the sixth electrode 280 may be disposed opposite to each other with respect to the fifth electrode 270.

The fourth electrode 260 and the sixth electrode 280 may be the cathodes, and the fifth electrode 270 may be the anode. The fourth electrode 260, the fifth electrode 270, and the sixth electrode 280 may share the second structure 100b and be electrically connected because current flows through the second 2DEG layer 120b. Accordingly, the diode may be provided between the fourth electrode 260 and the fifth electrode 270, and the diode may be provided between the fifth electrode 270 and the sixth electrode 280.

FIGS. 6A to 6D are cross-sectional views illustrating a method for manufacturing the bridge diode in FIG. 3.

Figure 6A:
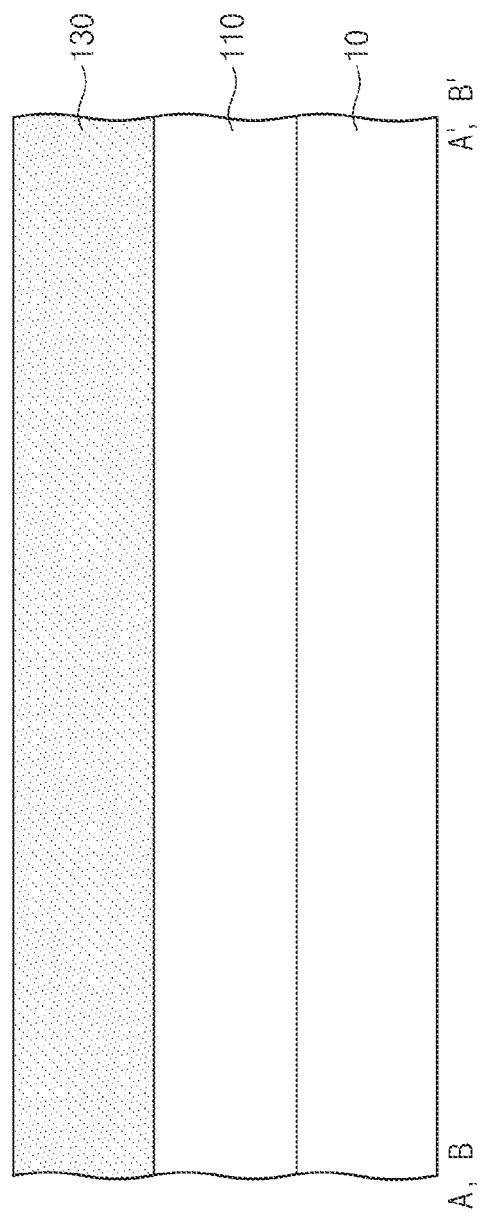

Referring to FIG. 6A, the lower nitride film 110 and the upper nitride film 130 may be sequentially formed on the substrate 10. The lower nitride film 110 and the upper nitride film 130 may be formed by using a method such as metal-organic chemical vapor deposition (MOCVD), molecular beam epitaxy (MBE), hydride vapor phase epitaxy (HYPE), and e-beam evaporation. However, the method for forming the lower nitride film 110 and the upper nitride film 130 is not limited thereto. The lower nitride film 110 may be made of gallium nitride (GaN), and the upper nitride film 130 may be made of aluminum gallium nitride (AlGaN).

Referring to FIG. 6B, the lower nitride film 110 and the upper nitride film 130 may contact each other to form the 2DEG layer 120 in the lower nitride film 110. The upper nitride film 130 may have a greater energy band gap than that of the lower nitride film 110, and the 2DEG layer 120 may be formed due to discontinuity of the energy band gap. The cap layer 140 may be formed on the upper nitride film 130. The cap layer 140 may be formed by using the method such as the metal-organic chemical vapor deposition (MOCVD), the molecular beam epitaxy (MBE), the hydride vapor phase epitaxy (HYPE), and the e-beam evaporation. However, the method for forming the cap layer 140 is not limited thereto. The cap layer 140 may be formed to form the semiconductor layer 100.

Figure 6C:
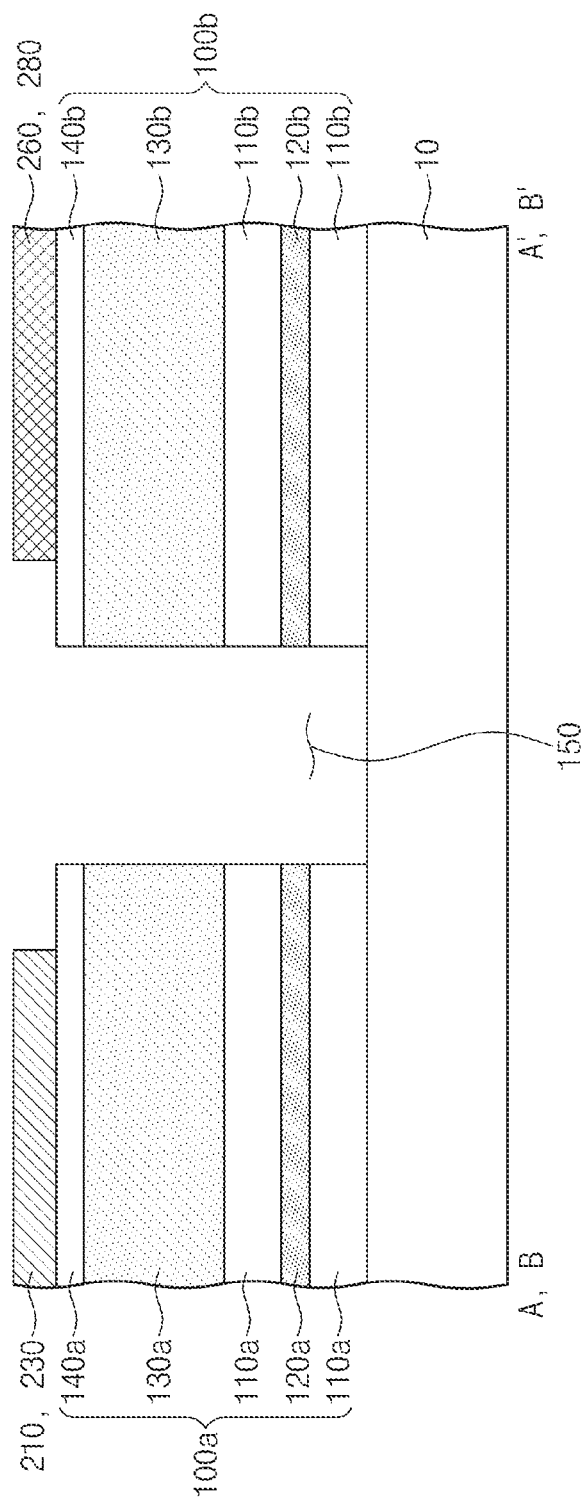

Referring to FIG. 6C, a mesa etching process may be performed to form the isolation region 150 in the semiconductor layer 100. The mesa etching process may be a dry type etching process. The mesa etching process may be performed to expose the top surface of the substrate 10. Through the mesa etching process, the first structure 100a including the first lower nitride film 110a, the first DEG layer 120a, the first upper nitride film 130a, and the first cap layer 140a and the second structure including the second nitride film 110b, the second DEG layer 120b, the second upper nitride film 130b, and the second cap layer 140b may be formed. Thereafter, a deposition process may be performed to form the first electrode 210 or the third electrode 230 on the first structure 100a. The deposition process may be performed to form the fourth electrode 260 or the sixth electrode 280 on the second structure 100b. The first electrode 210 or the third electrode 230 may form the schottky-contact with the first structure 100a, and the fourth electrode 260 or the sixth electrode 280 may form the ohmic-contact with the second structure 100b. To form the ohmic-contact with the second structure 100b, a heat treatment process such as rapid thermal anneal (RTA) may be additionally performed to the fourth electrode 260 or the sixth electrode 280. The heat treatment process may be performed at a temperature of about 800° C. to about 900° C. The first electrode 210 or the third electrode 230 may be the anodes, and the fourth electrode 260 and the sixth electrode 280 may be the cathodes.

Figure 6D:
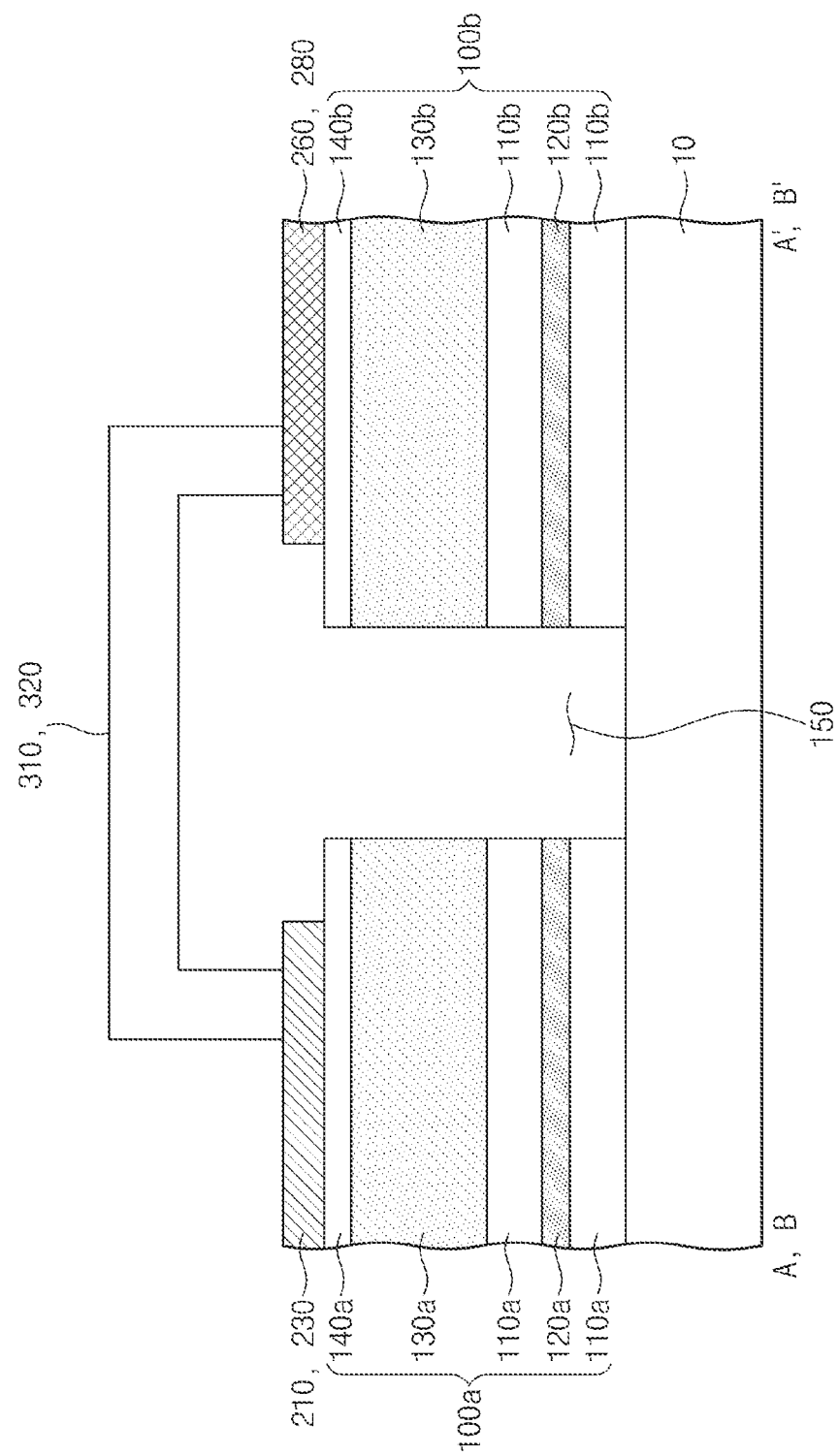

Referring to FIG. 6D, the first wire 310 for connecting the first electrode 210 to the sixth electrode 280 and the second wire 320 for connecting the third electrode 230 to the fourth electrode 260 may be formed. The first wire 310 or the second wire 320 may be made of air-bridge metal. For example, the first wire 310 or the second wire 320 may be made of metal containing at least one or more from copper (Cu), gold (Au), and nickel (Ni).

According to an embodiment of the inventive concept, the bridge diode 1 may be realized through disposing the semiconductor layer and connecting the electrodes to the wires, which are provided on one substrate 10, instead of the structure in which separated diodes are connected. Accordingly, the cost for manufacturing the bridge diode 1 may be reduced, and the manufacturing process may be simplified.

Figure 7:
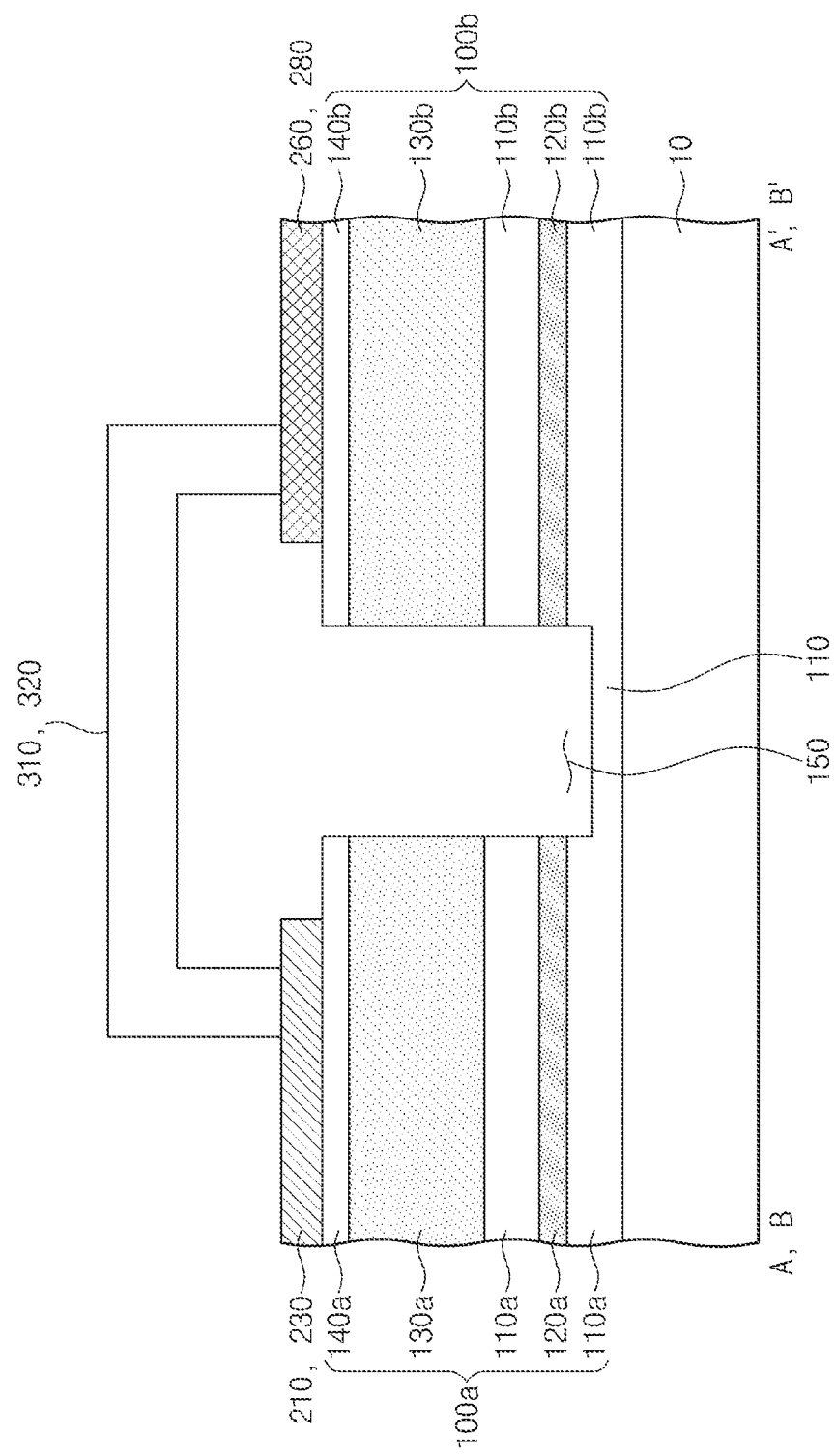
FIG. 7 is a cross-sectional view illustrating a modified example of the bridge diode in FIG. 3.

FIG. 7 is a cross-sectional view illustrating a modified example of the bridge diode in FIG. 3. For simplicity of description, describing contents overlapped with those in FIG. 3 will be omitted.

Referring to FIG. 7, the isolation region 150 that does not expose the substrate 10 may be formed. The mesa etching process may be performed to separate the DEG layers 120a and 120b respectively disposed in the first lower nitride film 110b and the second lower nitride film 110b. For example, the mesa etching process may be performed to be recessed at a depth of about 3000 Å from the first cap layer 140a and the second cap layer 140b toward the substrate 10. That is, the isolation region 150 may separate the DEG layers 120a and 120b from each other and expose the lower nitride film 110. According to an embodiment, the lower nitride film 110 may be a region in which the first lower nitride film 110a is connected to the second lower nitride film 110b.

The DEG layers 120a and 120b need to be separated not to form the diode between the first structure 100a and the second structure 100b. However, the first structure 100a and the second structure 100b may share the lower nitride film 110. Thus, the isolation region 150 may not expose the substrate 10.

Figure 8:
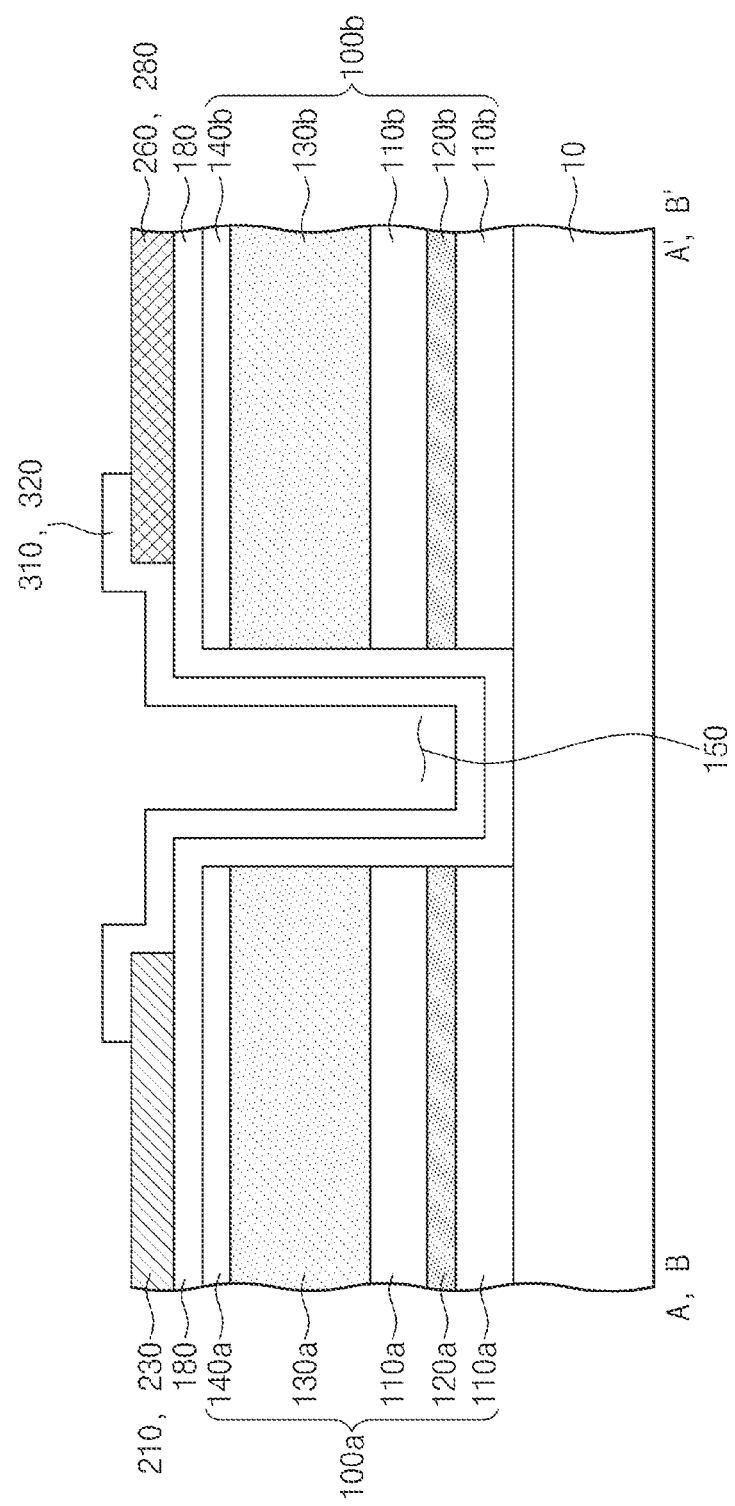
FIG. 8 is a cross-sectional view of a bridge diode according to an embodiment of the inventive concept.

FIG. 8 is a cross-sectional view of the bridge diode according to an embodiment of the inventive concept. For simplicity of description, describing contents overlapped with those in FIG. 3 will be omitted.

Referring to FIG. 8, the first structure 100a and the second structure 100b may be disposed on the substrate 10. The isolation region 150 may separate the first DEG layer 120a of the first structure 100a from the second DEG layer 120b of the second structure 100b.

A protection layer 180 for covering the first structure 100a, the second structure 100b, and an inner wall of the isolation region 150 may be provided. In detail, the protection layer 180 may be disposed on the first cap layer 140a and the second cap layer 140b and extend to cover the inner wall of the isolation region 150. For example, the protection layer may include a silicon oxide SiO2, silicon nitride (SiNx), or ceramic (Al$_2$O$_3$).

The first electrode 210 and the sixth electrode 280 or the third electrode 230 and the fourth electrode 260 may be disposed on the protection layer 180. The first electrode 210 or the third electrode 230 may be disposed on the first structure 100a, and the fourth electrode 260 or the sixth electrode 280 may be disposed on the second structure 100b.

The first wire 310 for connecting the first electrode 210 to the sixth electrode 280 and the second wire 320 for connecting the third electrode 230 to the fourth electrode 260 may be provided. The first wire 310 or the second wire 320 may be disposed on the first structure 100a and the second structure 100b and cover a portion of the exposed protection layer 180. The first wire 310 or the second wire 320 may be disposed on the protection layer 180 covering the inner wall of the isolation region 150. For example, the first wire 310 or the second wire 320 may be made of metal containing at least one or more from copper (Cu), gold (Au), and nickel (Ni).

Figure 9A:
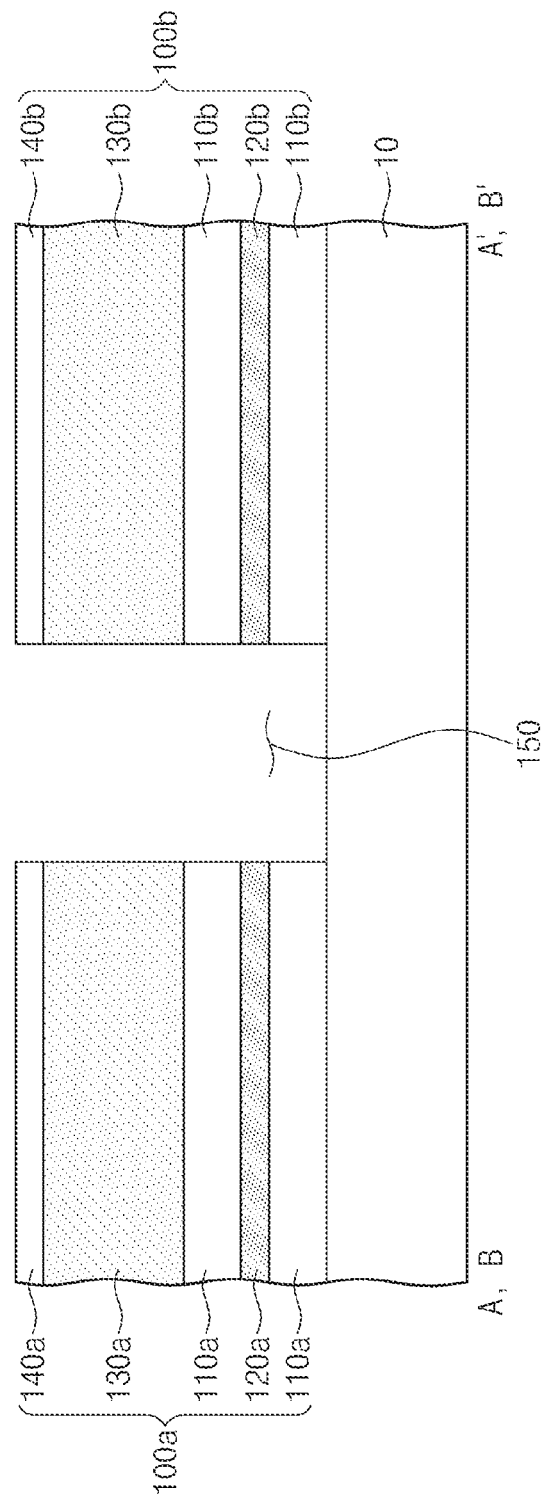
Figure 9B:
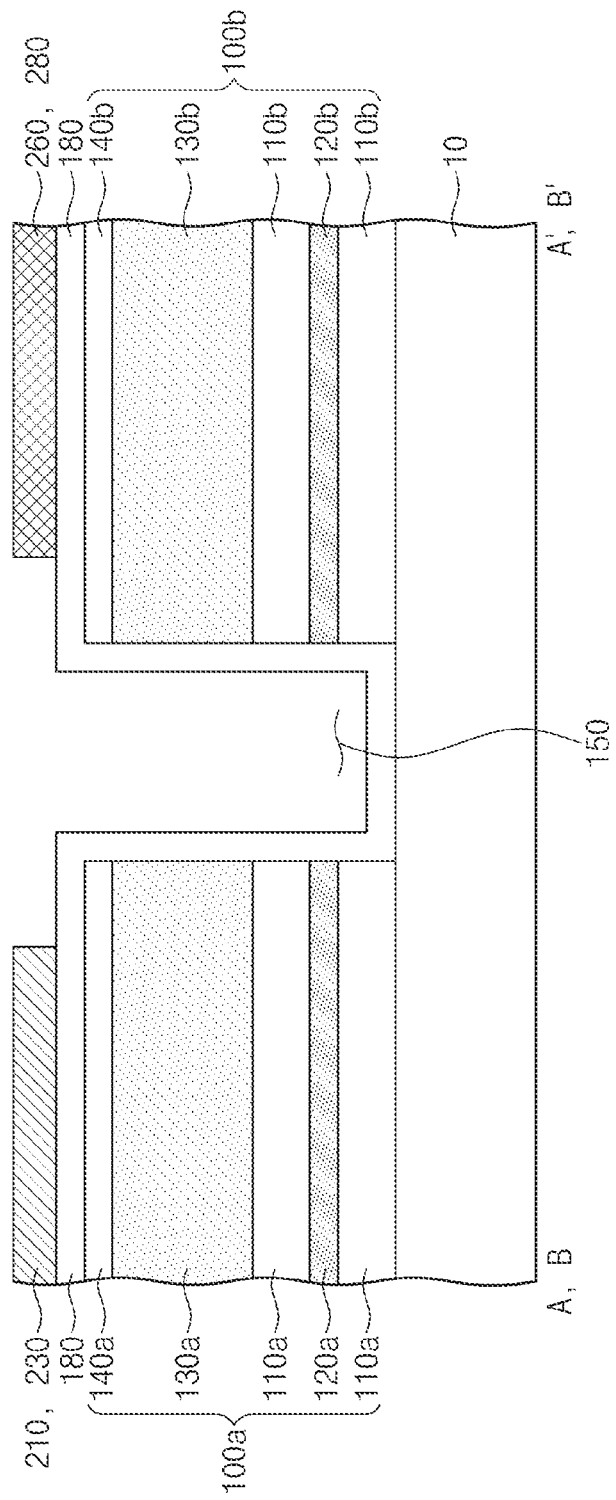

FIGS. 9A to 9C are cross-sectional views illustrating a method for manufacturing the bridge diode in FIG. 8. For simplicity of description, describing contents overlapped with those in FIGS. 6A to 6D will be omitted.

Referring to FIG. 9A, the isolation region 150 may be formed to provide the first structure 100a and the second structure 100b on the substrate 10. The isolation region 150 may be formed through the mesa etching process. The mesa etching process may be a dry-type etching process. The mesa etching process may be performed to expose the substrate 10.

Referring to FIG. 9B, the protection layer 180 for covering top surfaces of the first structure 100a and the second structure 100b and the inner wall of the isolation region 150 may be formed. The protection layer 180 may be formed by using an inductively coupled plasma-chemical vapor deposition (IPC-CVD). However, the method for forming the protection layer 180 may not be limited thereto. For example, the protection layer may include a silicon oxide (SiO2), silicon nitride (SiNx), or ceramic (Al$_2$O$_3$). The first electrode 210 and the sixth electrode 280 or the third electrode 230 and the fourth electrode 260 may be disposed on the protection layer 180. The first electrode 210 or the third electrode 230 may be disposed on the first structure 100a, and the fourth electrode 260 or the sixth electrode 280 may be disposed on the second structure 100b.

Referring to FIG. 9C, the first wire 310 for connecting the first electrode 210 to the sixth electrode 280 and the second wire 320 for connecting the third electrode 230 to the fourth electrode 260 may be formed. The first wire 310 or the second wire 320 may cover the protection layer 180 that is exposed through the deposition process and contact the first electrode 210 and the sixth electrode 280 or the third electrode 230 and the fourth electrode 260.

Figure 10:
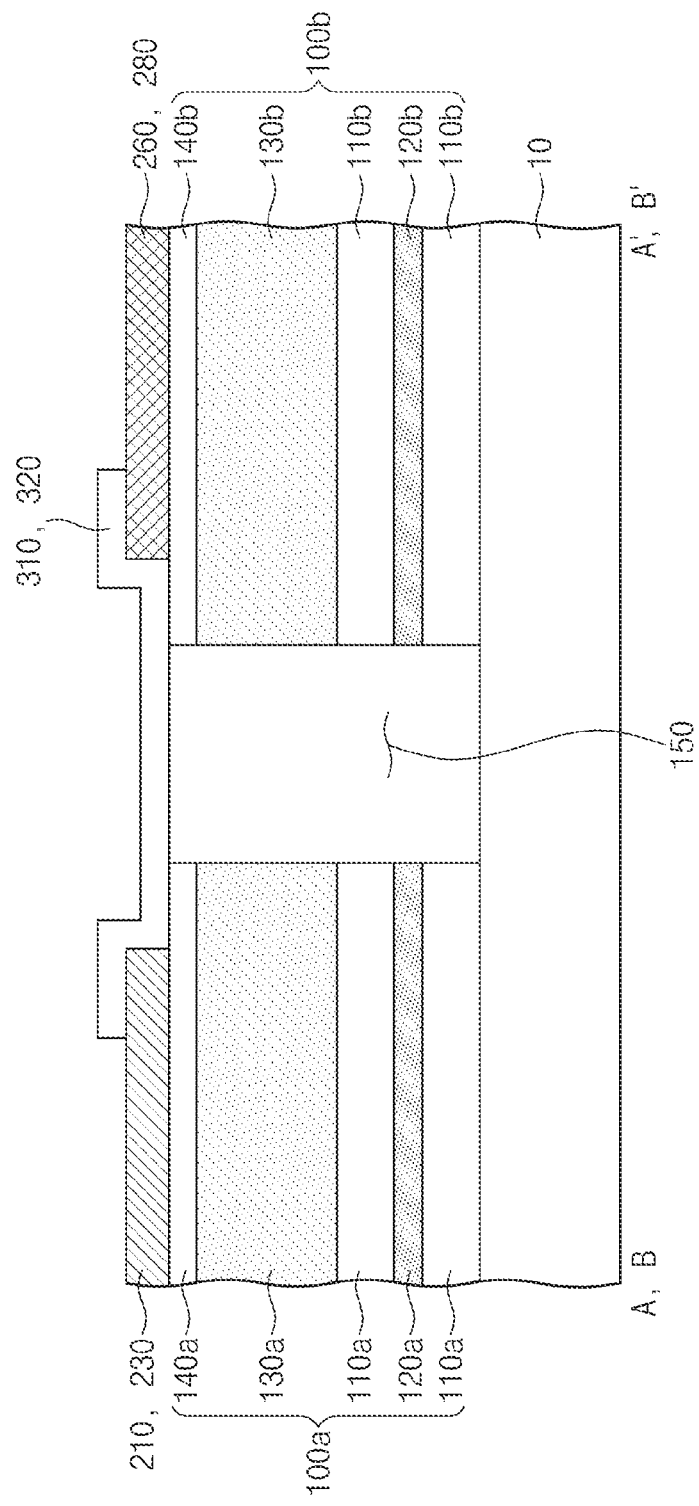
FIG. 10 is a cross-sectional view of a bridge diode according to an embodiment of the inventive concept.

FIG. 10 is a cross-sectional view of a bridge diode according to an embodiment of the inventive concept. For simplicity of description, describing contents overlapped with those in FIG. 3 will be omitted.

Referring to FIG. 10, the first structure 100a and the second structure 100b may be disposed on the substrate 10. The isolation region 150 may be provided between the first structure 100a and the second structure 100b. The isolation region 150 may be a region into which a p-type impurity is injected. Since the first structure 100a and the second structure 100b may be n-type semiconductor layer, the first structure 100a and the second structure 100b may be separated from each other through the isolation region 150 doped with the p-type impurity. Also, the first DEG layer 120a of the first structure 100a and the second DEG layer 120b of the second structure 100b may be separated from each other through the isolation region 150.

The first wire 310 for connecting the first electrode 210 to the sixth electrode 280 and the second wire 320 for connecting the third electrode 230 to the fourth electrode 260 may be provided. The first wire 310 or the second wire 320 may cover the first cap layer 140a and the second cap layer 140b, which are exposed, and cover the top surface of the isolation region 150. For example, the first wire 310 or the second wire 320 may be made of metal containing at least one or more from copper (Cu), gold (Au), and nickel (Ni).

Figure 11A:
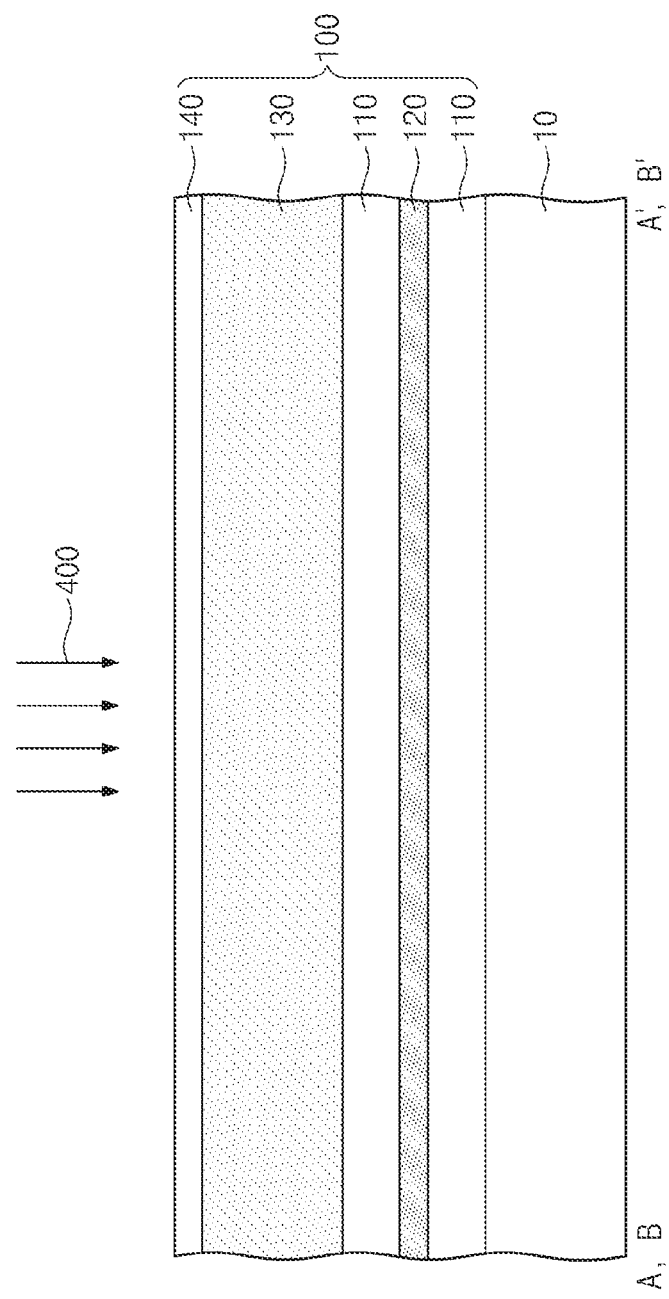
FIGS. 11A to 11C are cross-sectional views illustrating a method for manufacturing the bridge diode in FIG. 10.
Figure 11B:
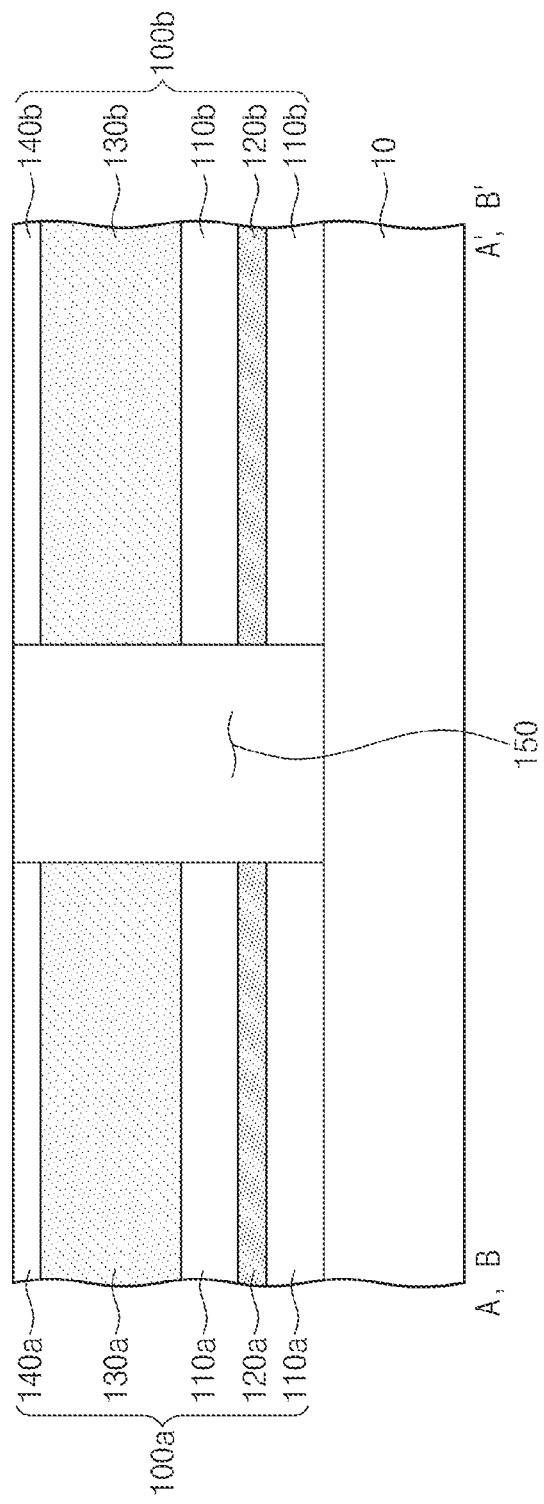
Figure 11C:
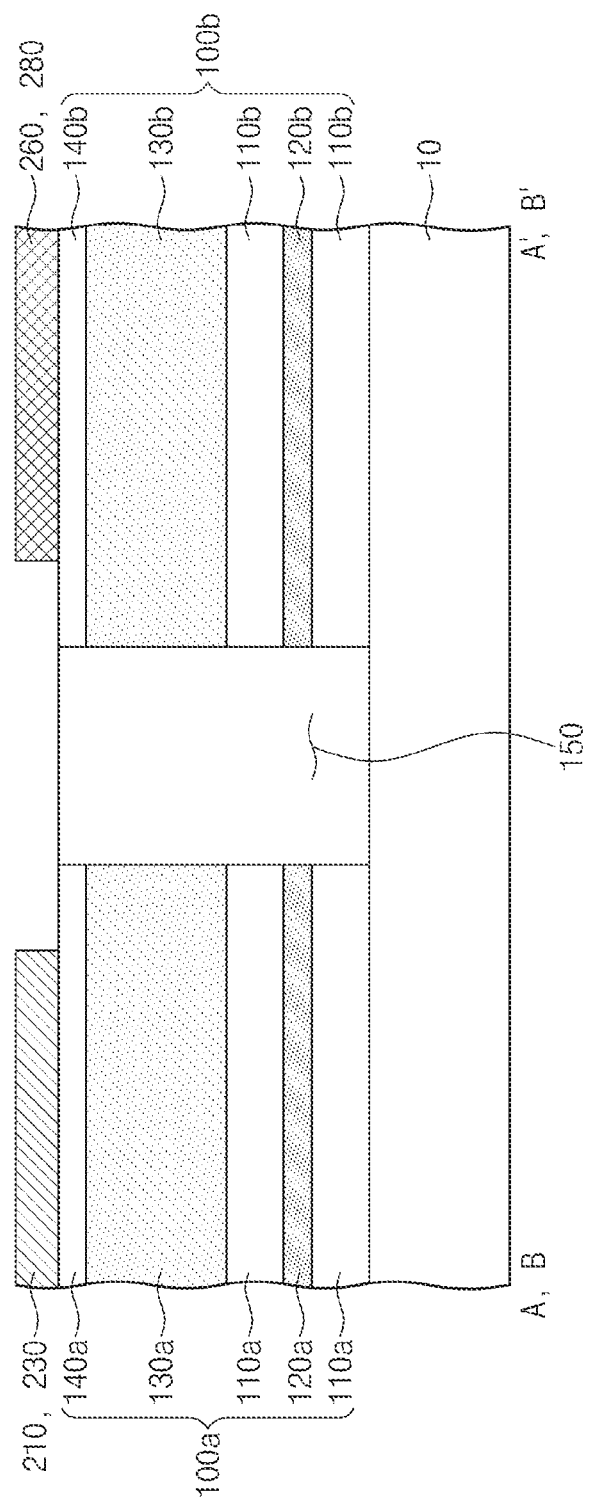

FIGS. 11A to 11C are cross-sectional views illustrating a method for manufacturing the bridge diode in FIG. 10.

Referring to FIG. 11A, the semiconductor layer 100 in which the lower nitride film 110, the upper nitride film 130, and the cap layer 140 are sequentially laminated on the substrate 10 may be formed, and a p-type impurity 400 may be injected into the semiconductor layer 100. The p-type impurity 400 may be injected into a central portion of the top surface of the semiconductor layer 100. For example, the p-type impurity may be boron or nitrogen.

Referring to FIG. 11B, the p-type impurity 400 may be injected to form the isolation region 150. The first structure 100a and the second structure 100b may be separated through the isolation region 150. For example, the isolation region 150 may contact the substrate 10. For another example, the isolation region 150 may be formed to have a depth that may separate the first DEG layer 120a of the first structure 100a from the second DEG layer 120b of the second structure 100b.

Referring to FIG. 11C, the deposition process may be performed to form the first electrode 210 or the third electrode 230 on the first structure 100a and the fourth electrode 260 or the sixth electrode 280 on the second structure 100b. The first electrode 210 or the third electrode 230 may form the schottky-contact with the first structure 100a, and the fourth electrode 260 or the sixth electrode 280 may form the ohmic-contact with the second structure 100b.

Unlike the above-described examples, the arrangement of the first to sixth electrodes 210, 220, 230, 260, 270, and 280 and the number and arrangement of the first to sixth extension parts 215, 225, 235, 265, 275, and 285 may not be limited thereto.

According to the embodiment of the inventive concept, the bridge diode having the structure performing the same function as that of the structure in which four diodes are coupled to each other on one substrate using the nitride based semiconductor layer.

According to the embodiment of the inventive concept, the process of forming the bridge diode may be simplified and the manufacturing cost may be reduced. Also, the bridge diode may be miniaturized.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A bridge diode comprising:
a substrate;
a first structure comprising a first lower nitride film and a first upper nitride film, which are laminated on the substrate;
a second structure comprising a second lower nitride film and a second upper nitride film, which are laminated on the substrate;
a first electrode structural body disposed on the first structure;
a second electrode structural body disposed on the second structure; and
an isolation region disposed between the first structure and the second structure, the isolation region exposing a top surface of the substrate,
wherein the first electrode structural body comprises a first electrode, a second electrode, and a third electrode, the second electrode structural body comprises a fourth electrode, a fifth electrode, and a sixth electrode,
the first electrode and the sixth electrode, which are connected to each other, are connected to an external circuit,
the third electrode and the fourth electrode, which are connected to each other, are connected to the external circuit, and
each of the second electrode and the fifth electrode is connected to the external circuit.

2. The bridge diode of claim 1, wherein the first lower nitride film and the second lower nitride film comprises first and second 2-dimensional electron gas (2DEG) layers, respectively, and
the first 2DEG layer and the second 2DEG layer are spaced apart from each other.

3. The bridge diode of claim 1, wherein the first electrode, the second electrode, the third electrode, the fourth electrode, the fifth electrode, and the sixth electrode are arranged in a clockwise direction,
the first electrode and the sixth electrode are disposed to face each other, and
the third electrode and the fourth electrode are disposed to face each other.

4. The bridge diode of claim 1, wherein the first electrode and the third electrode have first and third extension parts each of which extends toward the second electrode, respectively, and
the second electrode has a second extension part extending toward the first electrode and the third electrode.

5. The bridge diode of claim 4, wherein each of the first extension part, the second extension part, and the third extension part is provided in plurality to be spaced apart from each other.

6. The bridge diode of claim 1, wherein the fourth electrode and the sixth electrode have fourth and sixth extension parts each of which extends toward the fifth electrode, respectively, and
the fifth electrode has a fifth extension part extending toward the fourth electrode and the sixth electrode.

7. The bridge diode of claim 6, wherein each of the fourth extension part, the fifth extension part, and the sixth extension part is provided in plurality to be spaced apart from each other.

8. The bridge diode of claim 1, wherein the first electrode, the third electrode, and the fifth electrode are anodes which form a schottky-contact with the first structure and the second structure, and
the second electrode, the fourth electrode, and the sixth electrode are cathodes which form ohmic-contact with the first structure and the second structure.

9. The bridge diode of claim 1, wherein the first and second lower nitride films are made of gallium nitride (GaN), and
the first and second upper nitride films are made of aluminum gallium nitride (AlGaN) or aluminum nitride (AlN).

10. The bridge diode of claim 1, further comprising a first cap layer disposed between the first structure and the first electrode structural body; and
a second cap layer disposed between the second structure and the second electrode structural body.

11. A bridge diode comprising:
a semiconductor layer disposed on a substrate; and
an electrode structural body disposed on the semiconductor layer,
wherein the electrode structural body comprises a first electrode, a second electrode, a third electrode, a fourth electrode, a fifth electrode, and a sixth electrode, the first electrode and the sixth electrode, which are connected to each other, are connected to an external circuit, the third electrode and the fourth electrode, which are connected to each other, are connected to the external circuit, each of the second electrode and the fifth electrode is connected to the external circuit, and the semiconductor layer has an isolation region configured to separate the first, second, and third electrodes from the fourth, fifth, and sixth electrodes and expose a top surface of the substrate;

wherein the first electrode, the third electrode, and the fifth electrode form a schottky-contact with the semiconductor layer, and the second electrode, the fourth electrode, and the sixth electrode form an ohmic-contact with the semiconductor layer.

12. The bridge diode of claim 11, wherein the isolation region is recessed from a top surface of the semiconductor layer toward the substrate.

13. The bridge diode of claim 11, wherein the semiconductor layer comprises a lower nitride film and an upper nitride film, which are sequentially laminated on the substrate, the lower nitride film has a 2-dimensional electron gas (2DEG) layer therein, and the isolation region is recessed from the top surface of the semiconductor layer toward the lower nitride film to separate the 2DEG layer.

14. The bridge diode of claim 11, further comprising a first wire configured to connect the first electrode to the sixth electrode; and a second wire configured to connect the third electrode to the fourth electrode.

* * * * *